(12) United States Patent
Christen

(10) Patent No.: US 6,497,193 B2
(45) Date of Patent: *Dec. 24, 2002

(54) SCANNED FOCUS DEPOSITION SYSTEM

(75) Inventor: Hans M. Christen, Burtonsville, MD (US)

(73) Assignee: Neocera, Inc., Beltsville, MD (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/326,585

(22) Filed: Jun. 7, 1999

(65) Prior Publication Data

US 2001/0035128 A1 Nov. 1, 2001

(51) Int. Cl.$^7$ .............................................. C23C 14/00
(52) U.S. Cl. .................. 118/50.1; 118/620; 156/272.8; 156/272.4; 219/121.66; 219/121.68; 219/121.69; 219/121.73
(58) Field of Search ............................. 118/726, 50.1; 372/24; 505/474; 219/121.36, 121.66, 121.68, 121.69, 121.73; 156/272.8, 272.4

(56) References Cited

U.S. PATENT DOCUMENTS

| 3,508,814 A | 4/1970 | Aas ............................... 359/209 |
| 3,642,343 A | 2/1972 | Tchejeyan et al. ........... 250/234 |
| 4,218,112 A | 8/1980 | Ruker .......................... 250/234 |
| 4,327,959 A | 5/1982 | Minoura et al. ............. 359/201 |
| 4,504,110 A | 3/1985 | Pittenger ...................... 359/357 |
| 4,568,142 A | 2/1986 | Iguma .......................... 359/823 |
| 5,144,120 A | 9/1992 | Krichever et al. ..... 235/462.14 |
| 5,374,817 A | 12/1994 | Bard et al. ................... 359/210 |
| 5,534,489 A | * 7/1996 | Hayashi et al. .............. 505/474 |
| 5,606,449 A | 2/1997 | Nishiyama ................... 250/234 |
| 5,622,567 A | * 4/1997 | Kojima et al. ............... 118/726 |
| 5,654,975 A | * 8/1997 | Green et al. .................. 372/24 |
| 5,661,290 A | 8/1997 | Bard et al. ............. 235/462.42 |
| 5,724,173 A | 3/1998 | Chuan .......................... 250/234 |

OTHER PUBLICATIONS

C. Doughty, et al, "Steady state pulsed laser deposition target scanning for improved plume stability and reduced particle density", Appl. Phys. Lett. 66(10), Mar. 1995.*
C. Doughty et al, "Steady state pulsed laser deposition target scanning for improved plume stability and reduced particle density", Appl. Phys. Lett. 66(10), 6.3.95, 1276–1278.*

* cited by examiner

Primary Examiner—Gregory Mills
Assistant Examiner—Rudy Zervigon
(74) Attorney, Agent, or Firm—Rosenberg, Klein & Lee

(57) ABSTRACT

There is provided a deposition system (1) for yielding substantially uniform deposition of an evaporant material onto a substrate. The deposition system (1) comprises: a source (10) for generating a coherent energy beam; a substantially planar target (60) containing the evaporant material and disposed in spaced relation to the substrate; a focusing element (30) optically coupled to the source for focusing the coherent energy beam onto the target (60); and, an actuator (40) coupled to the focusing element (30) for reversibly translating the focusing element (30) along a scanning path directed substantially parallel to a target plane defined by the target (60). The focused coherent energy beam defines an impingement spot (14) on the target (60). The impingement spot (14) is displaced responsive to the translation of the focusing element (30) along the scanning path. The focus of the coherent energy beam on the target (60) thus remains substantially preserved.

7 Claims, 5 Drawing Sheets

SCANNED FOCUS DEPOSITION SYSTEM

BACKGROUND OF THE INVENTION

1. Field of the Invention

The subject scanned focus deposition system is generally directed to a system for uniformly depositing an evaporant material onto a substrate. More specifically, the scanned focus deposition system is directed to a laser deposition system wherein the uniform deposition of evaporant material from a target onto a substrate is facilitated by optimally controlling the target material's consumption.

Generally in laser deposition techniques, an evaporant material source is excited by a coherent energy beam such that particles of the evaporant material are released from the source and deposited onto a proximally disposed substrate surface. In these deposition techniques, the evaporant source—or target—may be placed, along with a substrate, within a vacuum chamber. A pulsed laser beam generated by a source located outside the vacuum chamber is then directed by optical components into the vacuum chamber. The optical components include, among other things, a focusing element which focuses the laser beam to impinge upon the target, defining an impingement spot. The concentrated energy at the impingement spot causes the generation of a highly directed evaporant plume that emanates from the target toward the proximally located substrate. The particles of target material contained in the evaporant plume then deposit onto the substrate's surface. By sustaining this deposition process while the substrate is rotated or otherwise displaced in controlled manner, a coating of target material may be formed on the substrate.

In many applications of this technique, the uniformity of deposition is of paramount concern. Numerous factors bear on the uniformity that may ultimately be realized. Perhaps chief among them is the degree to which the release of the target's evaporant material is regulated. The target includes a given mass of evaporant material which 'wears' as the deposition process progresses. The progressive wear of evaporant material potentially yields ruts and divots formed in the surface of the target. Consequently, the regularity (concentration, direction of release, . . . ) with which particles of the evaporant material are released from the target is quickly disrupted unless adequate aversive measures are taken. There is, therefore, a need for a deposition system wherein such aversive measures are adequately taken to optimize the uniformity of deposition that the system may realize.

2. Prior Art

Deposition systems, including pulsed laser deposition systems, incorporating one or more aversive measures to minimize the detrimental effects of target wear are known in the art. The best prior art known to Applicant includes U.S. Pat. Nos. 5,654,975; 5,724,173; 5,606,449; 5,661,290; 5,374,817; 5,144,120; 4,568,142; 4,504,110; 4,327,959; 4,218,112; 3,642,343; and, 3,508,814.

One aversive measure incorporated in deposition systems known in the art is to rotate the target about a rotation axis normal thereto. Another is to simultaneously scan the laser beam impinging upon the target along, for instance, the target's radial extent. A system employing these measures is disclosed in U.S. Pat. No. 5,654,975 entitled "SCANNING LASER BEAM DELIVERY SYSTEM," and assigned to the Assignee of the present invention. In that system, a laser beam source and a beam transfer assembly cooperatively generate and direct an optical path having a terminal segment that impinges upon a target evaporant. An automatically controlled scanning mechanism displaces the beam transfer assembly in appropriate manner to translate the terminal segment of the optical beam path in a direction substantially normal to the longitudinal direction along which it extends.

While this system yields marked improvement over prior art deposition systems in the uniformity of deposition realized on a substrate, a number of shortcomings yet prevail. First, the strict lateral translation of the optical beam path terminal segment does not necessarily preserve the normal distance between the given focusing element and the target surface. In typical deposition systems, the planar front face of the target is not squarely oriented towards the incoming energy beam; for, the incident angle formed by the incoming beam relative to the target's front face must be something other than 90° if the resulting evaporant plume is to be directed towards the given substrate and not directly back towards the incoming energy beam, itself. Consequently, as the incoming beam is translated in a direction normal to its propagating direction, the focusing element is displaced either toward or away from that portion of the target's front facial plane on which it is to direct the energy beam. The beam's focus on the target is thus disturbed. That is, the effective shape and size of the impingement spot which the incoming energy beam forms on the target at a given instant in time is not preserved.

Another shortcoming prevails in the fact that the beam transfer assembly comprising all the optical components for forming at least the terminal segment of the energy beam is displaced in its entirety to effect the lateral translation of the beam path terminal segment. The practical inefficiencies inherent in such cumbersome manipulation of components are readily apparent.

SUMMARY OF THE INVENTION

Accordingly, it is an object of the present invention to effect substantially uniform deposition of evaporant material contained in a target onto a substrate.

It is another object of the present invention to realize substantially uniform deposition of the target evaporant material onto a substrate using a pulsed laser deposition technique.

It is another object of the present invention to optimally regulate the consumption of the target evaporant material.

It is another object of the present invention to scan at least that portion of a coherent energy beam impinging upon the target in a manner that optimally preserves the beam's focus on the target.

It is yet another object of the present invention to effect the necessary scanning of a coherent energy beam in a simple and efficient manner.

It is still another object of the present invention to scan a coherent energy beam along the target by translating a focusing element along a scanning path that substantially preserves the beam's focus on the target.

These and other objects are attained in the present invention which provides a deposition system for substantially uniform deposition of an evaporant material onto a substrate. The deposition system comprises: a source for generating a coherent energy beam; a substantially planar target containing the evaporant material which is disposed in spaced relation to the substrate; a focusing element optically coupled to the source for focusing the coherent energy beam onto the target; and, an actuator coupled to the focusing element for reversibly translating that focusing element along a scanning path directed substantially parallel to a target plane defined by the target. The focused coherent energy beam defines an impingement spot on the target. The impingement spot is displaced responsive to the translation of the focusing element along the scanning path. The focus of the coherent energy beam on the target thus remains substantially preserved.

While enhanced uniformity of deposition may be realized in accordance with the present invention even without target rotation, the target is rotated in a preferred embodiment about a target rotation axis substantially normal to the target plane. Also in that embodiment, the actuator is adapted to translate the focusing element in reciprocal manner in accordance with a predetermined rate profile. The rate profile is defined based upon the position of the impingement spot relative to the target rotation axis. Preferably, the rate profile is defined by a substantially sinusoidal displacement profile, the rate of focusing element translation being inversely related to the displacement of the impingement spot from the target rotation axis.

In an alternate embodiment, the scanning path for the focusing element is described by a plurality of directional components. Each directional component in that embodiment is substantially parallel to the target plane.

DETAILED DESCRIPTION OF THE PREFERRED EMBODIMENTS

Figure 1:
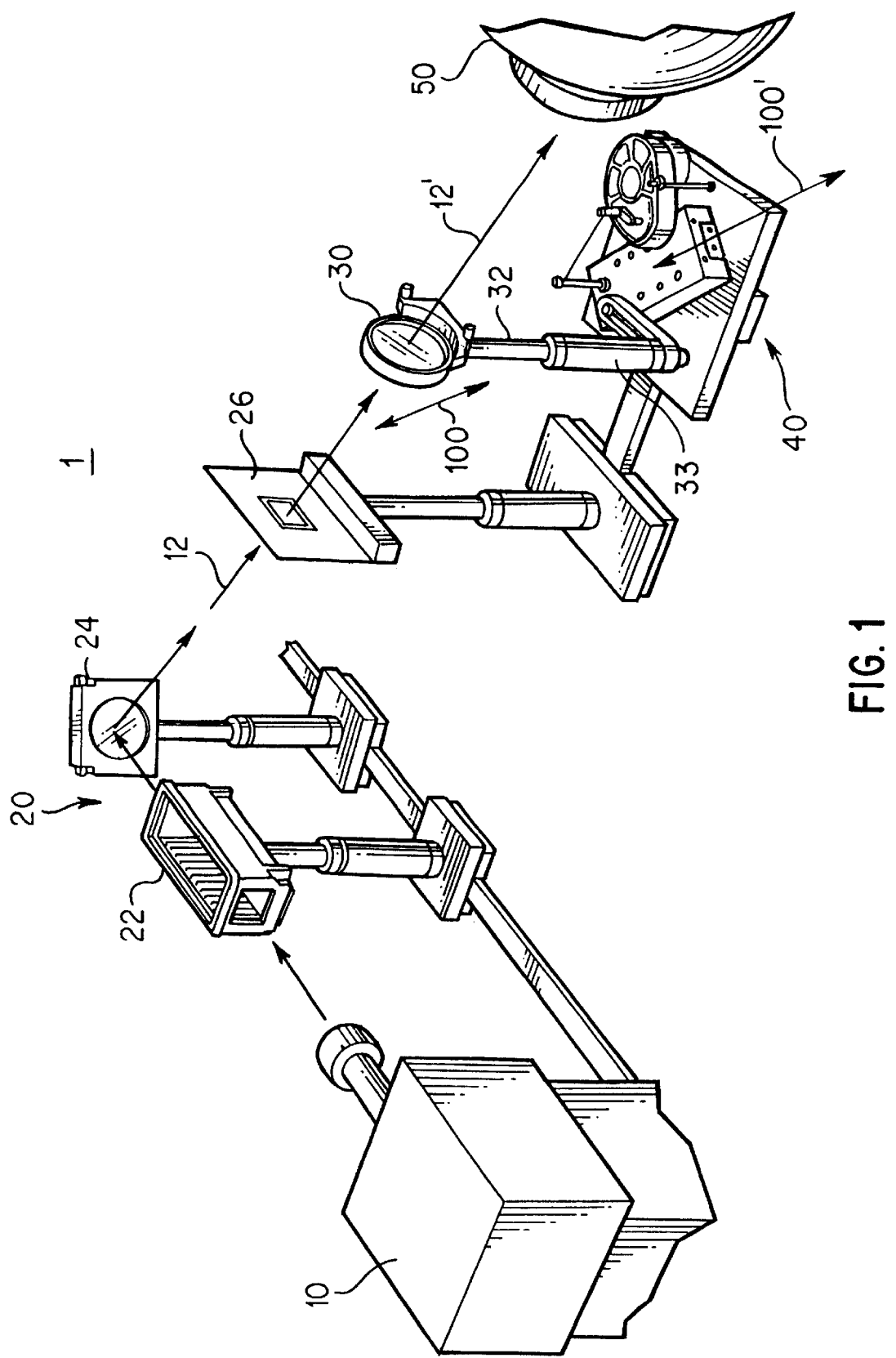
FIG. 1 is a perspective view, partially cut-away, of one embodiment of the present invention in a typical application.

Turning now to FIG. 1, there is shown an exemplary arrangement of components for one embodiment of the invention. System 1 generally includes a source 10 for generating a coherent energy beam 12; a focusing element 30 for focusing beam 12 onto a target (not shown) contained within a vacuum chamber 50; and, an actuator 40 for translating along a scanning path indicated by the bi-directional arrow 100. System 1 also includes an assembly 20 of components for guiding and/or delivering energy beam 12 to focusing element 30.

Component assembly 20 may include as many or as few components as are necessary for a given application. It may, for example, include a filter 22, a beam splitter or reflector 24, and an aperture element 26. These components 22, 24, 26, however, are shown only for exemplary purposes, for assembly 20 may include any suitable components known in the art. In certain applications where system requirements permit, it may not even be necessary to employ assembly 20. In such applications, energy beam 12 would be delivered by the given source 10 directly to focusing element 30.

Preferably, coherent energy beam 12 is a pulsed laser beam that is generated by a pulsed laser source of any suitable type known in the art.

Focusing element 30 preferably includes a convex lens 31 characterized by a finite focal distance. It may be embodied in any of numerous configurations and forms other than that shown. It is important, however, that the focusing portion—or lens 31 in the embodiment shown—possess sufficient radial or transaxial extent such that as it is scanned along the range of displacement described by scanning path 100, pulsed laser beam 12 remains fully directed through its focusing portion.

Focusing element 30 is supported by such suitable means as a neck 32 telescopically received within a base 33. Focusing element 30 is initially positioned by its supporting structure at a sufficient distance from the given target (not shown) that the length of impingement beam segment 12' generated by its lens 31 preferably approaches, if not equals, the lens' characteristic focal distance.

Figure 2:
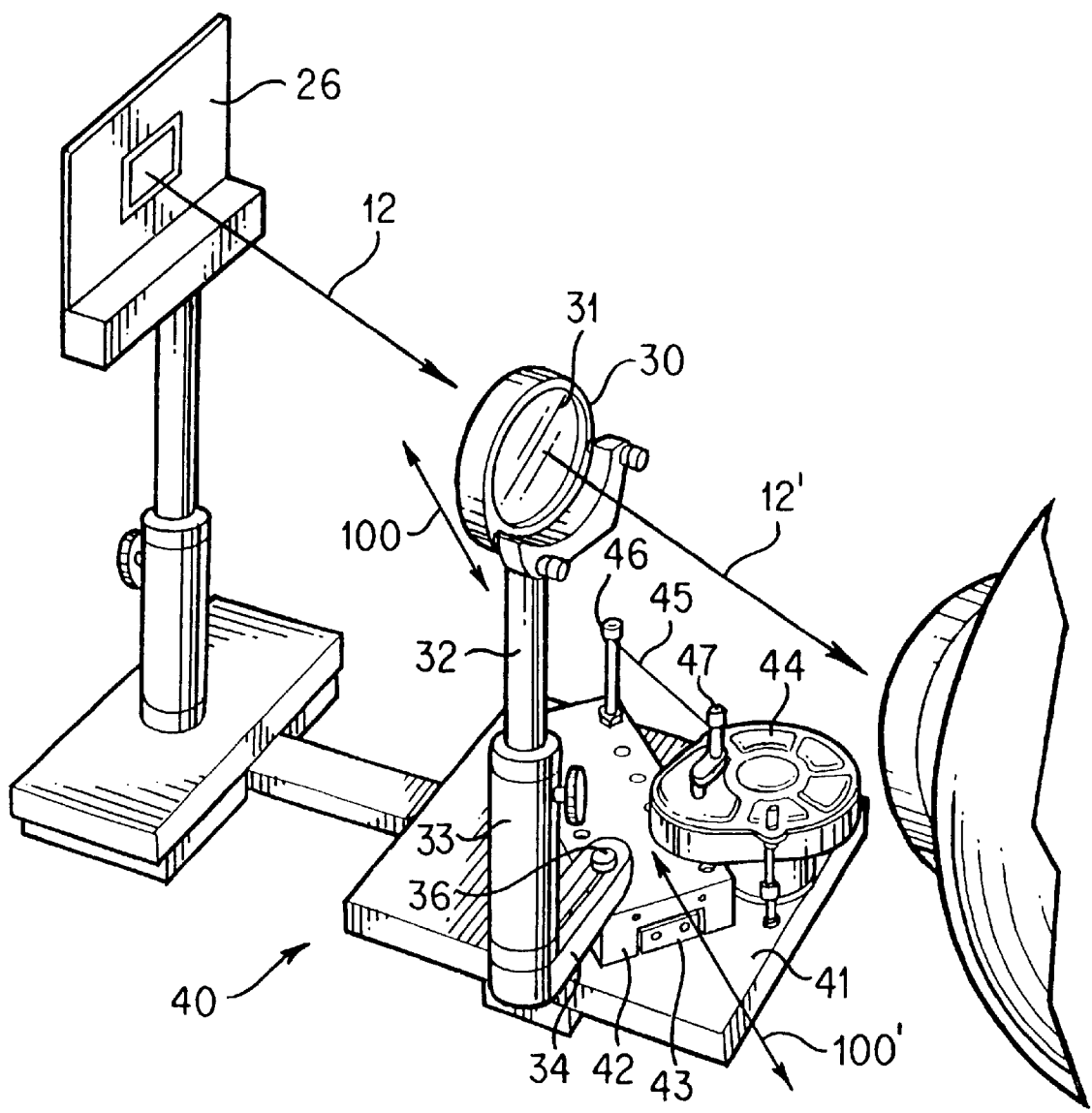
FIG. 2 is a detailed perspective view, partially cut-away, of a portion of the system shown in FIG. 1.
Figure 3A:
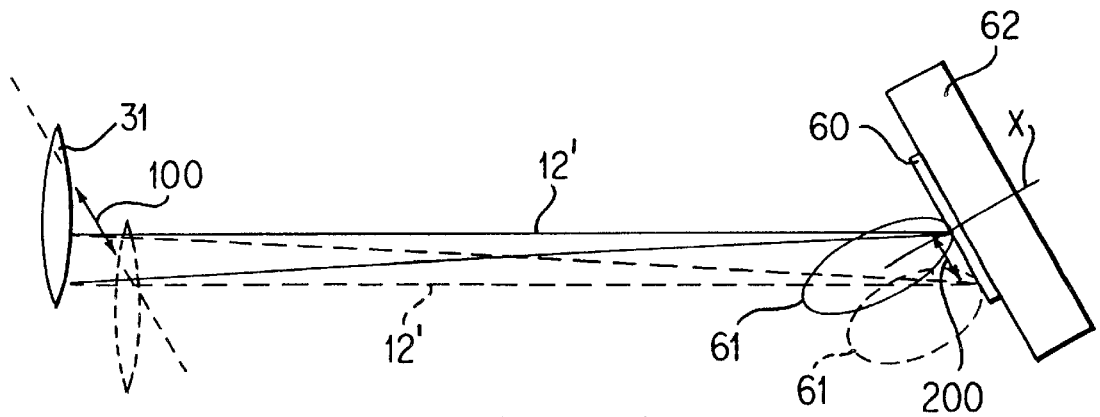
FIG. 3A is a schematic diagram illustrating an exemplary translation of the focusing element in an embodiment of the present invention.
Figure 3B:
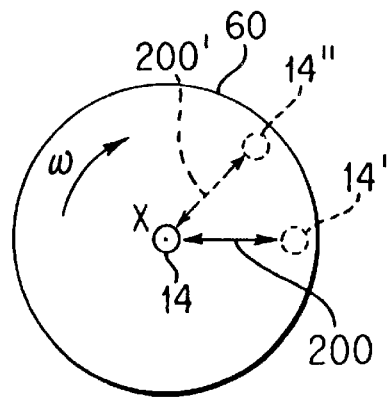
FIG. 3B is a schematic diagram illustrating exemplary scan paths as projected on a target plane that may be realized in accordance with the present invention.

Referring now to FIGS. 2–3B, impingement beam segment 12' is thus substantially focused onto the given target 60. Impingement beam segment 12' impinges upon the front surface of target 60 to define thereon (at a given instant in time) an impingement spot 14 of a particular shape and size. The focused energy at impingement spot 14 then causes an evaporant plume 61 to form and emanate therefrom. The particulate constituents forming evaporant plume 61 are highly directed away from the substantially planar surface of target 60, toward an opposing substrate for deposition into/onto that substrate's surface (not shown).

The directivity of an evaporant plume 61 thus formed is very much dependent upon the planar orientation of target 60. It is, therefore, necessary that a substantially planar target plane defined by the target's front surface (facing the incoming energy beam) be oriented at an angle other than 90° relative to the incoming impingement beam segment 12'. Otherwise, the resulting evaporant plume 61 would be squarely directed back towards focusing element 30. Any attempt to place the substrate in the path of the resulting plume 61 would then also necessarily place that substrate in the path of impingement beam segment 12', obstructing further operation. For this reason, target 60 is retained by a support mechanism 62 such that it defines a target plane which forms an angle of 45°, or some other suitable value (in at least one dimension), relative to the axis of the incoming impingement beam segment 12'. This allows the substrate to be placed safely out of the path of impingement beam segment 12'.

As the evaporant material that forms target 60 is consumed by the process of generating successive evaporant plumes 61, pits, ruts, divots, and other surface irregularities tend naturally to occur on target 60. As discussed in preceding paragraphs, such surface irregularities tend to disturb significantly enough the directivity of subsequently formed evaporant plumes 61 that acceptable levels of deposition uniformity become virtually impossible to attain.

One preventive measure typically taken is to minimize the dwell time of impingement beam spot 14 on any particular portion of target 60 by scanning that impingement spot 14 along, for instance, a direction 200 as the target 60 itself is rotated by a predetermined angle ω about a target rotation axis X (preferably defined along the normal to the target plane defined by target 60). This leads to a gradually progressing, generally even wear, or consumption, of target 60. This, in turn, leads to greater uniformity of deposition on the substrate. Ideally, the shape and size of impingement spot 14 is preserved, even as it travels through the range of displacements along an impingement spot scan path 200 between, preferably, a point at or near the rotation axis and a distal point 14'. That is, the focus of impingement beam 12' on target 60 is substantially preserved despite the scanning.

In accordance with the present invention, this preservation of focus is simply yet precisely realized by translating focusing element 30—or at least the focusing lens portion 31 of focusing element 30—along a scanning path 100 directed substantially parallel to the target plane defined by the front surface of target 60. In the embodiment shown, this translation of focusing element 30 occurs only along the horizontal dimension. Note, however, that the translation may be along a composite scanning path having a non-zero component along both the horizontal and vertical dimensions, so long as the composite scanning path remains on a plane parallel to the target plane. Such an embodiment is indicated in FIG. 3B by the impingement spot scan path 200' defining a range of impingement spot displacements from rotation axis X to a distal point 14".

While not shown in the Drawings, the composite scan path may in certain embodiments map a complex and irregular pattern, where the available resources and applicable requirements permit. Where a programmable controller(s) is available, for instance, optimal patterns of high complexity may be automatically generated and implemented in the scan, dynamically or otherwise.

Any suitable measures known in the art may be employed to effect the necessary translation of focusing element 30 along the given scanning path 100. In the exemplary embodiment of FIG. 1, the translation is effected automatically in reciprocal manner utilizing the mechanism shown in greater detail in FIG. 2. Actuator 40 in this embodiment includes a base 41 on which is disposed an elongate rail 43. A support block 42 is slidably engaged to rail 43 to be displaceable along the actuating direction indicated by bi-directional arrow 100'. Preferably, actuating direction 100' is parallel to the scanning path 100.

Coupled to support block 42 is a suspension arm 34 extending from the focusing element's base 33. Suspension arm 34 is fixedly mounted to support block 42 by a suitable fastener 36 which may be released to adjust the position of suspension arm 34 relative to that support block 42.

The displacement of support block 42 along rail 43 is controlled by a motor 44 or other comparable mechanism known in the art adapted to generate the force required for the displacement. The force generated by motor 44 is transferred to support block 42 via a substantially rigid transfer link 45 extending between a pin member 46 anchored to support block 42 and a pin member 47 anchored to motor 44. Transfer link 45 is coupled by suitable means to pin members 46, 47 in angularly displaceable manner.

During operation, then, motor 44 generates a displacement of pin member 47. Responsive to this displacement, pin member 46 is caused via transfer link 45 to undergo an accommodating displacement, which it imparts to support plate 42. The direction of displacement is limited to actuating direction 100' by the engagement of support plate 42 with rail 43. The displacement of support plate 42 over rail 43 yields the displacement of focusing element 30 along scanning path 100.

Referring again to FIG. 3B, the effective dwell time of impingement spot 14 at target rotation axis X cannot equal its effective dwell time at, for instance, point 14' on target 60 which is radially offset from rotation axis X. Since target 60 is rotated about axis X, the instantaneous linear velocity at point 14' on target 60 is necessarily greater than the instantaneous linear velocity at a second point on target 60 offset from target axis X by a lesser radial distance. Consequently, the effective dwell time of impingement spot 14 at point 14', for instance, would invariably be less than the effective dwell time of impingement spot 14 at or near target axis X—unless the scanning rate is accordingly controlled. Preferably, therefore, the translation of focusing element 30 along scanning path 100 is carried out in accordance with a predetermined rate profile that is based upon the displacement profile of the resulting impingement spot 14 relative to target rotation axis X.

Figure 4:
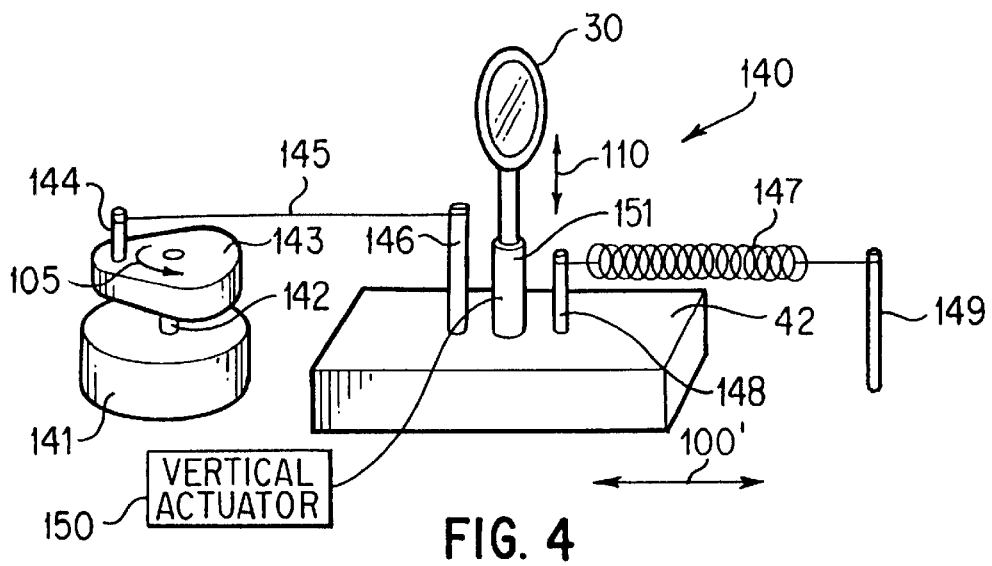
FIG. 4 is an illustrative diagram showing an alternate embodiment of a portion of the present invention.

One such predetermined rate profile may be defined in accordance with a substantially sinusoidal displacement profile, with the scanning rate being inversely related to the radial displacement of impingement spot 14 from the target rotation axis X. The scanning rate, in accordance with that profile, is varied during a scan cycle to attain a minimum value at the radially outermost point(s) on target 60 reached by impingement spot 14 during its displacement along scan path 200, and a maximum where impingement spot 14 is at its radially innermost point along that scan path 200. The alternate embodiment of actuator 40 shown in FIG. 4 represents one exemplary means by which such sinusoidal profile may be effected. Note that scan path 200 may extend substantially across the diametric extent of target, traversing rotation axis X.

Figure 3C:
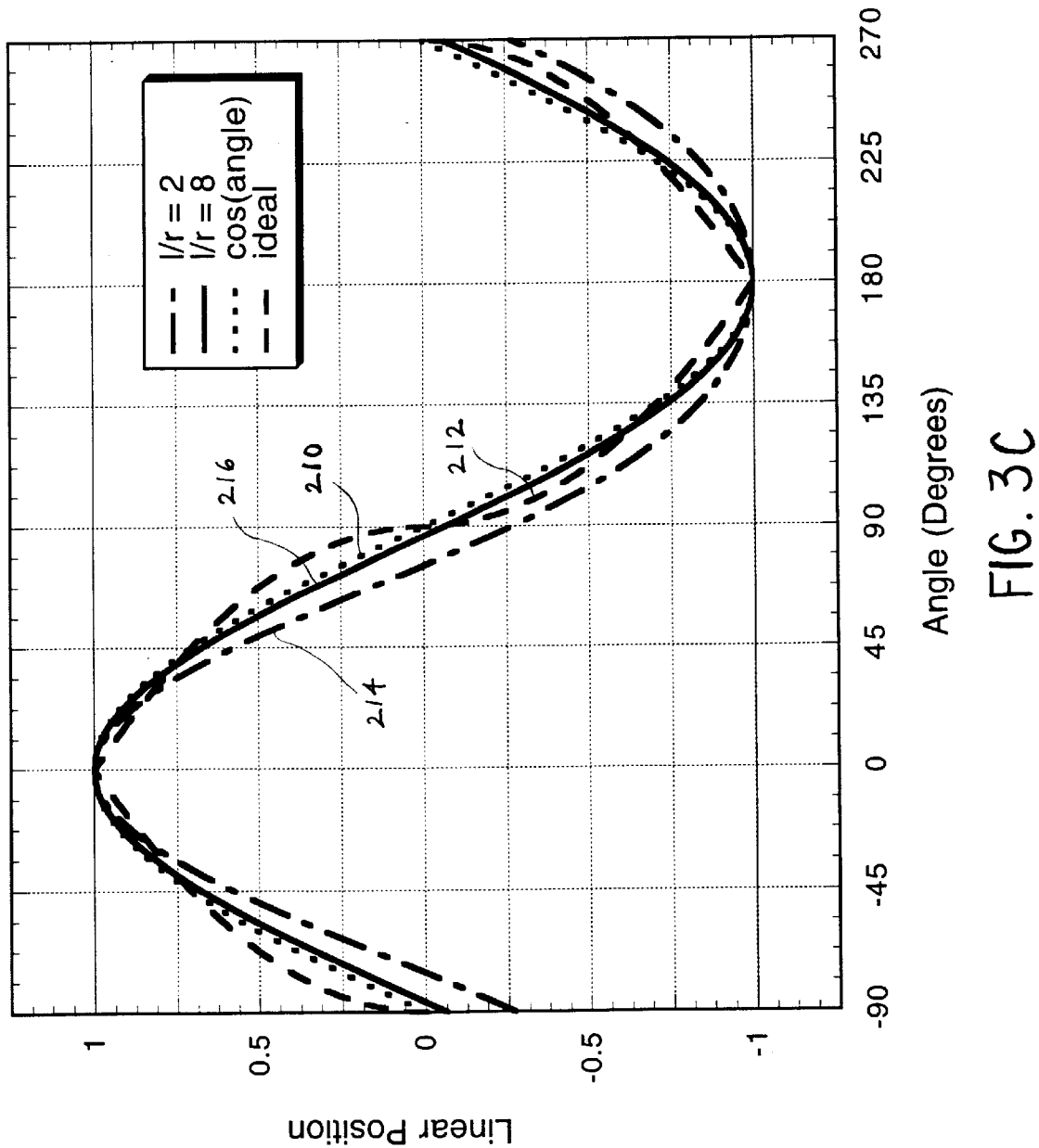
FIG. 3C is a graphic diagram illustrating exemplary displacement profile curves pertaining to exemplary application of the present invention.

FIG. 3C graphically illustrates examples of substantially sinusoidal displacement profiles that may be employed in an exemplary embodiment of the present invention. As there shown, the instantaneous linear position of impingement spot 14 (in proportional units relative to the target's rotation axis X) is plotted against the corresponding instantaneous angle values within one complete cycle of the given scanning action. Curve 210 simply represents, for referential purposes, the cosine curve defined by the angle values within the scan cycle shown. Similarly, curve 212 effectively represents the ideal case—that is, where optimal target wear is realized given an infinitesimally small impingement spot 14 scanned through a path traversing the target's rotation axis X.

Curves 214 and 216 profile exemplary scanning actions that may be effected in accordance with the present invention. With LO denoting, for instance, the length of transfer link 45 and r representing the radial displacement of pin member 47 from the central shaft (not shown) of motor 44, curve 214 represents the case where the ratio of l/r is rather low, equaling approximately 2 or so; whereas, curve 216 represents the case where the l/r ratio is relatively high, equaling approximately 8 or so. Note that the higher l/r ratio of curve 216 causes it to more closely follow the reference cosine curve 210.

Among other things, it is graphically apparent from these curves that the instantaneous rate at which scanning occurs varies from a minimum value at the points of maximum linear displacement (from the target's rotation axis X) to a maximum value at the target's rotation axis X (where linear position equals 0). Given a motor 44 operating at a fixed frequency (at a fixed rpm), the angle values denoting instantaneous angular displacement positions within a motor shaft revolution would map linearly to a time reference. The instantaneous slope of each curve 214, 216, which reaches a minimum at the given curve's amplitude extremes, is therefore indicative of (for instance, proportional to) the instantaneous scan rate.

Referring next to FIG. 4, there is illustrated an alternate embodiment 140 of the translation actuator. In this embodiment, actuator 140 includes a motor 141 that drives an axial shaft 142 to which a platform member 143 is coupled. A pin member 144 extends from platform member 143, and a transfer link 145 couples pin member 144 to a pin member 146 extending from support block 142 (whose details, for the sake of clarity, are not shown). Where transfer link 145 is substantially rigid, suitable accommodating measures must be taken such as the rotatable coupling of pin members 144, 146 respectively to platform member 143 and support block 42—or, alternatively, the angularly displaceable coupling of transfer link 145 to pin members 144 and 146. The embodiment shown, however, permits transfer link 145 to be formed from a flexible material, thus obviating these accommodating measures.

Actuator 140, in this embodiment, further includes a tension spring member 147 which extends between a pin member 148 affixed to support block 142 and a stationary pin member 149 affixed to base 41 (not shown) or some other fixed platform/surface. Spring member 147 possesses the properties sufficient for it to expand as the motor-driven rotation of platform member 143 indicated by the directional arrow 105 pulls transfer link 145 taut and, thereby, pulls support platform 142 along translation path 100'. During those phases of the platform member's rotation wherein pin member 144 is drawn towards pin member 146 (to relax the tension on transfer link 145), the tension of spring member 147 draws support block 142 in the opposing direction along translation path 100'. Spring member 147 thus serves to bias support block 42 towards stationary pin member 149. Reciprocal translation of support block 42 in either direction along path 100' may then occur even with motor 141 driving the translation in only one direction.

Actuator 140 may, if necessary, further include a vertical actuator component 150 coupled to a base 151 of focusing element 30 in such manner that vertical displacement of focusing element 30 may be effected concurrently with the horizontal translation thereof. When thus combined with the horizontal translation, the concurrent displacement of focusing element 30 indicated by the directional arrows 110 and 100' would, depending on the control employed, enable any of numerous effective beam scan paths to be described on the given target plane. In certain embodiments, vertical actuator component 150 may be programmable (as may the unshown control for motor 141).

Figure 5A:
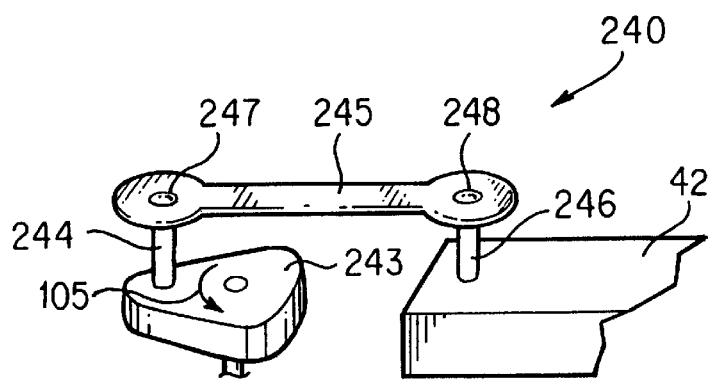
FIG. 5A is another alternate embodiment of a portion of the present invention.

Pertinent portions of another alternate embodiment 240 of the translation actuator are shown in FIG. 5A. In this embodiment, the spring or other resilient element 147 and flexible translation link 145 are removed in favor of a transfer link 245 formed as a substantially rigid elongate arm member. Arm member 245 is coupled in angularly displaceable manner to a pin member 244 extending from platform member 243 and to a pin member 246 extending from support block 42. The angularly displaceable coupling may be realized through any suitable means, such as a ball bearing joint 247, 248. The reciprocating translation 42 is then fully driven by the rotation of platform member 243.

Figure 5B:
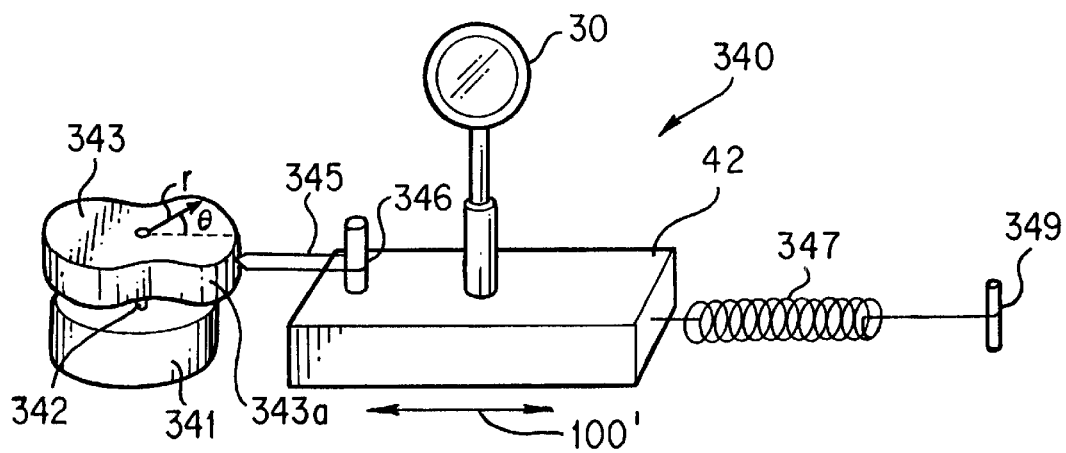
FIG. 5B is an illustrative diagram of yet another alternate embodiment of a portion of the present invention; and, FIG. 5C is an illustrative diagram of still another alternate embodiment of a portion of the present invention.

Yet another embodiment 340 of the translation mechanism is shown in FIG. 5B. As there shown, actuator 340, in this embodiment, employs a platform member 343 shaped with a predetermined peripheral contour. Platform member 343 is rotatably driven by a motor 341 via a drive shaft 342. The driven movement of platform member 343 is transferred to support block 42 by a substantially rigid transfer link member 345 that projects from a pin member 346 extending from support block 42 and engages the platform member's sidewall portion 343a. At the opposing end of support block 42 is coupled a spring or other resilient member 347 of suitable properties which biases support block 42 away from a stationary member 349 affixed to either base 41 (not shown) or other stationary platform/surface.

As platform member 343 in the given configuration is driven to rotate, the biasing force of spring member 347 maintains the abutting engagement of the platform member's sidewall portion 343a and transfer link 345. Consequently, the nature and extent of the support block's translation along the directions 100' are determined by the contour described by the platform member's sidewall portion 343a. That is, r(θ) is proportional to the instantaneous scanning rate, where parameters r and θ respectively represent the instantaneous distance from the axis of the platform's rotation to a point along the platform's peripheral outline and the instantaneous angular offset of a given radial extent from an angular reference.

Figure 5C:
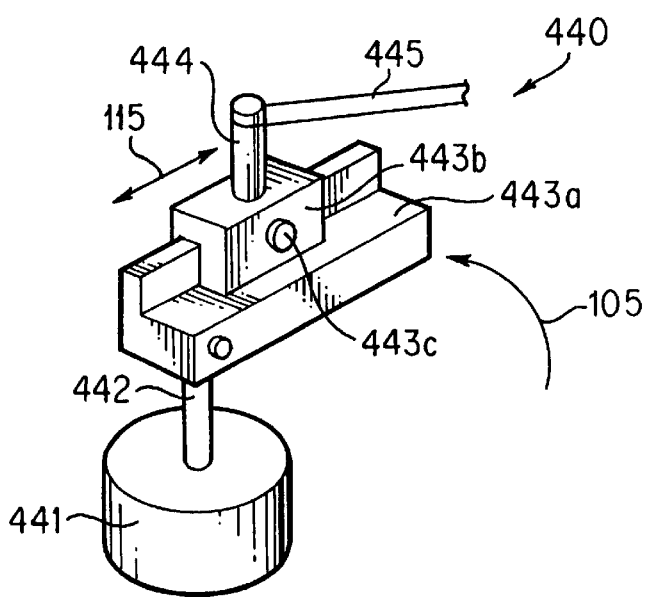

Pertinent portions of still another alternate embodiment 440 of the translation actuator is shown in FIG. 5C. Actuator 440 enables the adjustable re-configuration thereof necessary to vary the range of translation of support block 42 along path 100'. Actuator 440 includes a platform member 443a to which an adjustment member 443b is slidably coupled for adjustable displacement. Adjustment member 443b may thus be positioned on platform member 443a at any point along the range of displacement indicated by the bi-directional arrow 115. A securing member 443c is provided to releasably lock member 443b at a selected position.

Actuator 440 further includes a pin member 444 coupled securely to adjustment member 443b. The adjustable displacement of adjustment member 443b enables pin member 444 to be radially offset from the axis of the drive shaft 443 extending from the given motor 441. Since the driving force generated by motor 441 is transferred to support platform 42 via a transfer link 445 engaging pin member 444, the degree of movement transferred by actuator 440 is thus rendered selectively adjustable.

Note that this embodiment 440 of the translation actuator may be employed in combination with other features employed in a number of the preceding embodiments. Note also that by utilizing other suitable measures (not shown), the offset displacement of member 443b relative to platform member 443a may be controlled dynamically in further embodiments. Variability of the pin member 444 radial offset (along path 115) from the axis of drive shaft 442 could then be effected within a given drive cycle of motor 441. This would permit great flexibility in customizing the system's scan profile.

Although this invention has been described in connection with specific forms and embodiments thereof, it will be appreciated that various modifications other than those discussed above may be resorted to without departing from the spirit or scope of the invention. For example, equivalent elements may be substituted for those specifically shown and described, and certain features may be used independently of other features, all without departing from the spirit or scope of the invention as defined in the appended claims.

What is claimed is:

1. A deposition system for substantially uniform deposition of an evaporant material onto a substrate comprising:
   (a) a source for generating a coherent energy beam;
   (b) a substantially planar target disposed in spaced relation to the substrate and defining a target plane, said target containing the evaporant material and being rotated about a target rotation axis substantially normal to said target plane;
   (c) a displaceable focusing element optically coupled to said source for focusing said coherent energy beam onto said target, said focused coherent energy beam having a focal point and defining an inpingement spot on said target;
   (d) an actuator coupled to said focusing element for reversibly translating said focusing element along a transverse scanning path directed substantially parallel to said target plane for displacing said impingement spot over said target during rotation thereof, said actuator being adapted to translate said focusing element in accordance with a predetermined rate profile based upon the position of said impingement spot relative to said target rotation axis, said actuator including an angularly displaceable contour; and,
   (e) whereby said focal point maintains a substantially constant distance from said target, said focus of said coherent energy beam on said target remains substantially preserved and an energy intensity of said coherent energy beam at said impingement spot remains substantially constant.

2. A deposition system for substantially uniform deposition of an evaporant material onto a substrate comprising:
   (a) a source for generating a coherent energy beam;
   (b) a substantially planar target disposed in spaced relation to the substrate and defining a target plane, said target containing the evaporant material and being rotated about a target rotation axis substantially normal to said target plane;
   (c) a displaceable focusing element optically coupled to said source for focusing said coherent energy beam onto said target, said focused coherent energy beam having a focal point and defining an impingement spot on said target;
   (d) an actuator coupled to said focusing element for reversibly translating said focusing element along a transverse scanning path directed substantially parallel to said target for displacing said impingement spot over said target during rotation thereof, said actuator being adapted to translate said focusing element in accordance with a predetermined rate profile based upon the position of said impingement spot relative to said target rotation axis, said actuator including an angularly displaceable platform member; and, an adjustment member coupled to said platform member in selectively displaceable manner; and,
   (e) whereby said focal point maintains a substantially constant distance from said target, said focus of said coherent energy beam on said target remains substantially preserved and an energy preserved and an energy intensity of said coherent energy beam at said impingement spot remains substantially constant.

3. The deposition system as recited in claim 1 wherein said actuator is adapted to automatically translate said focusing element in reciprocal manner.

4. The deposition system as recited in claim 1 wherein said predetermined rate profile is defined by a substantially sinusoidal displacement profile, the rate of said translation being inversely related to the displacement of said impingement spot from said target rotation axis.

5. The deposition system as recited in claim 1 wherein said focusing element includes a convex lens.

6. The deposition system as recited in claim 1 wherein said scanning path is described by a plurality of directional components, each said directional component being substantially parallel to said target plane.

7. The deposition system as recited in claim 6 further comprising a vertical actuator coupled to said focusing element.

* * * * *